United States Patent [19]
Smith et al.

[11] Patent Number: 6,118,419
[45] Date of Patent: *Sep. 12, 2000

[54] RANDOM ELECTROSTATIC DISCHARGE EVENT INDICATOR

[75] Inventors: Craig A. Smith, Pittsford; Gordon F. Lupien, Jr., Ontario, both of N.Y.

[73] Assignee: Xerox Corporation, Stamford, Conn.

[ * ] Notice: This patent is subject to a terminal disclaimer.

[21] Appl. No.: 09/183,423

[22] Filed: Oct. 30, 1998

Related U.S. Application Data

[63] Continuation-in-part of application No. 08/720,650, Oct. 2, 1996, Pat. No. 5,986,629.

[51] Int. Cl.[7] .................................................... G06F 9/32
[52] U.S. Cl. ........................... 345/84; 345/107; 340/649; 349/199
[58] Field of Search ............................. 345/84, 107, 108; 349/199; 340/649

[56] References Cited

U.S. PATENT DOCUMENTS

| | | | |
|---|---|---|---|
| 4,126,854 | 11/1978 | Sheridon | 345/84 |
| 4,838,653 | 6/1989 | Mohebban | 350/332 |
| 5,737,115 | 4/1998 | Mackinlay et al. | 359/296 |
| 5,739,801 | 4/1998 | Sheridon | 345/84 |
| 5,767,826 | 6/1998 | Sheridon et al. | 345/84 |
| 5,986,629 | 11/1999 | Smith et al. | 345/84 |

*Primary Examiner*—Daniel J. Wu

[57] ABSTRACT

A method and apparatus for detecting random electrostatic discharge events is disclosed in which the electrostatic discharge indicator is "Electric Paper". The "Electric Paper" has a plurality of spheres having one hemisphere of one color and the other hemisphere of another color. The spheres rotate when an electric field is applied to them and are sensitive enough to respond to electrostatic discharge events. The "Electric Paper" may be pre-imaged so that a pattern indicating the state of the paper is visually ascertainable.

19 Claims, 7 Drawing Sheets

RANDOM ELECTROSTATIC DISCHARGE EVENT INDICATOR

This application is a continuation-in-part of application Ser. No. 08/720,650, filed Oct. 2, 1996. This is a continuation-in-part of commonly-assigned prior application Ser. No. 08/720,650, filed Oct. 2, 1996 by the same inventors hereof, now U.S. Pat. No. 5,986,629, granted Nov. 16, 1999, the disclosure of which prior application his hereby incorporated by reference verbatim, with the same effect as though such disclosure were fully and completely set forth herein.

This invention relates generally to an electrostatic discharge indicator, and more particularly concerns an electrostatic discharge indicator that records a random electrostatic discharge event and can be reset to its original state so that the indicator can be reused.

Many items such as solid state electronic components and unexposed photographic film are very sensitive to damage when exposed to electrostatic discharges (ESD). Electrostatic discharge events are usually very fast and the exposed items do not show any visible indication that they have been exposed to ESD until the item is formally tested or in use. Problems of earlier ESD indicators include separate processing steps to determine whether an ESD event has occurred, non-reusability of the indicator, the size of the indicator and the necessity of electrically or magnetically attaching the ESD indicator to the item to be monitored. The present invention solves all of the above problems.

The following disclosures may be relevant to various aspects of the present invention:

U.S. Pat. No. 4,286,210
Inventor: Ignatjev
Issued: Aug. 25, 1981
U.S. Pat. No. 4,782,299
Inventor: Argentieri
Issued: Nov. 1, 1988
U.S. Pat. No. 4,785,294
Inventor: Campbell
Issued: Nov. 15, 1988
U.S. Pat. No. 4,825,152
Inventor: Bossard
Issued: Apr. 28, 1985
U.S. Pat. No. 4,838,653
Inventor: Mohebban
Issued: Jun. 13, 1989
U.S. Pat. No. 3,668,106
Inventor: Ota
Issued: Jun. 6, 1972
U.S. Pat. No. 5,359,319
Inventor: Campbell et al.
Issued: Oct. 25, 1994
U.S. Pat. No. 5,461,369
Inventor: Campbell et al.
Issued: Oct. 24, 1995
U.S. Pat. No. 5,463,379
Inventor: Campbell et al.
Issued: Oct. 31, 1995
U.S. Pat. No. 4,126,854
Inventor: Sheridon
Issued: Nov. 21, 1978
U.S. Pat. No. 4,143,103
Inventor: Sheridon
Issued: Mar. 6, 1979
U.S. Pat. No. 5,389,945
Inventor: Sheridon
Issued: Feb. 14, 1995

Some relevant portions of the foregoing disclosures may be briefly summarized as follows:

U.S. Pat. No. 4,286,210 teaches an air ion and charge detector comprising a liquid crystal display having an indicator electrode and a reference electrode and connected to detect air ions or electrical charge. The detector also provide a visual indication of the air ionization or electrical charge.

U.S. Pat. No. 4,782,299 discloses a method for determining the location of an arc or corona occurring in a high voltage power supply. The technique uses sheets of sensitive photographic film which are placed between high voltage components and the metallic chassis walls of the power supply. During supply operation if an arc or corona occurs the film becomes exposed. The amount of exposure is determinative of the magnitude of the arc as well as indicative of the location of the arc or corona discharge which location and magnitude is determined by developing the film after the supply operation. In this manner a comparative analysis of the amount of corona or arc as a function of time can be made by comparing the film density after photographic chemical development. The technique enables one to accurately determine the magnitude of the arc or corona as well as its exact location.

U.S. Pat. No. 4,785,294 provides for a static monitoring system for use with an electronic manufacturing work area, typically a conventional work bench having an electrical conducting strap for connecting the operator's wrist to earth ground, and including a circuit for indicating when there is an earth ground connection and circuitry for indicating when an electrostatically charged object approaches the work station. An antenna is positioned at the work station spaced from the working surface and from the operator, with the antenna connected as an input to an amplifier circuit which measures the change in electrostatic field strength and hence the approach of a charged object, with an indicator providing a visual or audible alarm or both.

U.S. Pat. No. 4,825,152 discloses a transient field indicator using a photographic film to provide a visual record of the occurrence of a transient electrostatic or transient magnetic field by the inclusion of metallic patterns close to the film. The patterns are of a geometry to define gaps at which the fields are concentrated in a manner to interact with the film The film exhibits a light spot at the gap, when it is developed, if a field of sufficient intensity is present during the test period. The film packet is intended primarily for inclusion in shipping packages for sensitive electronic devices to provide a visual record of exposures during shipment.

U.S. Pat. No. 4,838,653 teaches a display comprised of a plurality of liquid crystal elements electrically connected in series. The element with the lowest capacitance when energized comprises a liquid crystal material having a positive dielectric anisotropy so that it has a higher capacitance when energized than when non-energized. A second element has a capacitance when non-energized lower than the capacitance of the first element when it is energized. The display can be used for detecting a voltage or an electric field.

U.S. Pat. No. 3,668,106 discloses an electrophoretic display and/or recording device in which an electrophoretic suspension layer including a dispersion of at least one electrophoretic material in a finely divided powder form is suspended in a suspending medium and interposed between a pair of electrodes. An electric field is imposed across the electrophoretic suspension layer to change the optical reflective property of the suspension layer by changing the spatial distribution of the electrophoretic material in the suspending medium electrophoretically.

U.S. Pat. Nos. 5,359,319, 5,461,369, and 5,463,379 all teach a detector for detecting electrostatic discharge events in an electronic component, assembly or system and including a display element which produces an immediate indication on exposure to a change in voltage level, an electrostatic discharge sensor, and a circuit for connecting the sensor to the display element.

U.S. Pat. Nos. 4,126,854, 4,143,103 and 5,389,945 teach a twisting ball panel display which has balls which rotate under the action of an electric field. This or a similar "Electric Paper" is used as an ESD indicator of the present invention.

Patent Application entitled "Reusable Electric Paper Labels for Data Storage Media," U.S. Ser. No. 08/578,258 filed Dec. 26, 1996 and assigned to the same assignee teaches an apparatus for printing an updated label on an information medium such as a floppy disk. A print bar built into a media driver is used to update a label on a piece of reusable Electric Paper attached to the disk after the disk is written into and then ejected from the driver.

All of the above references are hereby incorporated by reference.

SUMMARY OF THE INVENTION

One aspect of the invention is drawn to a detector for detecting and recording a random electrostatic discharge applied to an item in the vicinity of the detector including a first support of optically transparent material, a plurality of cavities in the support; and a plurality of optically and electrically anisotropic particles rotatably disposed in the cavities in the first support. Each of the particles electrical anisotropy providing an electrical dipole moment, disposed in an electric field while the electrical dipole moment is provided, the particle tends to rotate to an orientation in which the electrical dipole moment aligns with the electric field, the particles thus disposed being responsive to an electrostatic discharge applied to the support such that when the electrostatic discharge is applied to the support the particles thus exposed to the electrostatic discharge will tend to rotate in accordance with their electrical anisotropy to provide a first electrostatic discharge display in accordance with their optical anisotropy, the first electrostatic discharge display recording the random electrostatic discharge event occurring in the vicinity of the item.

Another aspect of the invention is drawn to a method of detecting and recording a random electrostatic discharge event occurring in the vicinity of an item includes placing a first support of optically transparent material having a plurality of cavities and a plurality of optically and electrically anisotropic particles rotatably disposed in the cavities in the first support, each of the particles electrical anisotropy providing an electrical dipole moment, disposed in an electric field while the electrical dipole moment is provided, the particle tends to rotate to an orientation in which the electrical dipole moment aligns with the electric field, the particles thus disposed being responsive to a random electrostatic discharge event applied to the support and exposing the first support to an electrostatic discharge, so that the particles exposed to the electrostatic discharge will rotate in accordance with their electrical anisotropy to provide a first electrostatic discharge display in accordance with their optical anisotropy.

Yet another aspect of the invention is drawn to a method of detecting an electrostatic discharge applied to an item including placing a support in electrostatic discharge detecting relationship to the item; the support having a plurality of particles contained therein, the particles being sensitive to electronic fields and visually indicating exposure to electronic fields, the particles being in a first visual state; and exposing the support to an electric field in the form of an electrostatic discharge so that the particles exposed to the electronic discharge have a second visual state which is different from the first visual state, wherein the second visual state occurs without further processing of the support.

A special "ink" has been developed to be used with a reimageable "paper" document that responds to electric fields by displaying either a black or white image depending upon the field orientation, the special "ink" and "paper" combination being called "Electric Paper". In one of many embodiments, the ink appears "white" after being exposed to a positive field and "black" after the field is reversed. Most any pair of colors could be chosen and either color can appear when a positive or negative field is applied. By using this ink to create a word, grayscale, bar-code, or other organized pattern, an indicator of ESD exposure is made. Once the pattern is exposed to an electrical field, the orientation of the particles in the ink change and the pattern initially placed on the label is altered. The pattern of the indicator is compared with the original pattern and a determination of ESD exposure is made based on the comparison. The indicator may have different sections which have different sensitivities to ESD, or the indicator could be made of a plurality of indicators in various combinations.

BRIEF DESCRIPTION OF THE DRAWINGS

Other features of the present invention will become apparent as the following description proceeds and upon reference to the drawings, in which.

DETAILED DESCRIPTION OF THE INVENTION

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

Figure 1:
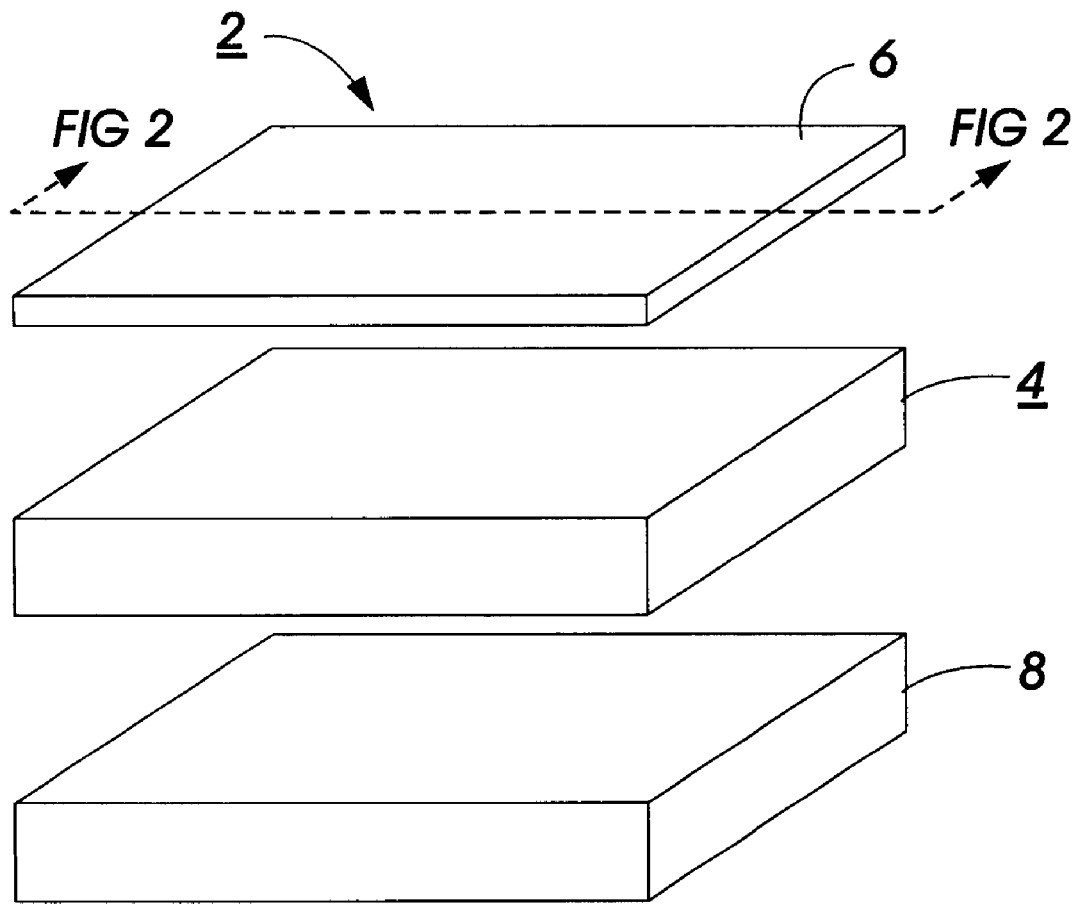
FIG. 1 is an exploded view of an "Electric Paper" display.
Figure 2:
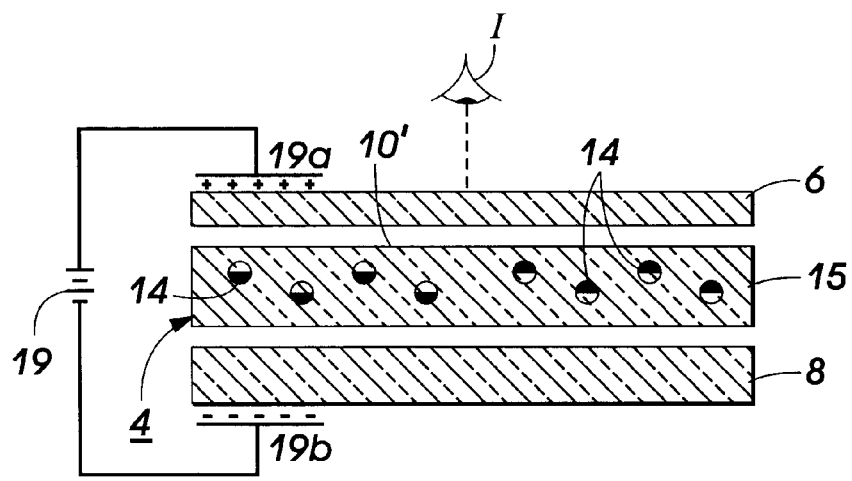
FIG. 2 is a sectional view of the display of FIG. 1 taken along line 2—2.

FIG. 1 shows an "Electric Paper" display 2 which is used as an ESD indicator of the present invention. Some discussion of the manner in which the display works will aid in understanding the ESD indicator application of "Electric Paper". Display 2 has a display panel 4 sandwiched between substrates 6 and 8. At least one of the substrates 6 and 8 are optically transparent so that ambient light can impinge upon the display panel 4 so that the display provided by panel 4 can be viewed, as shown in FIG. 2, where substrate 6 is optically transparent materials so that the ambient light incident upon the display will provide a visible image at 1. An optional conductive layer connected to a ground may coat the bottom of the display.

The display panel 4 includes a distribution of minute particles 14 which are optically anisotropic. The particles 14 are surrounded by a transparent dielectric fluid which, due to the optical anisotropy of the particles 14 and the difference in Zeta potential due to the coatings used to achieve that optical anisotropy, causes the particles 14 to have an electrical anisotropy. In addition to the particles 14 and the dielectric liquid which surrounds those particles, the panel 4 includes a solid, optically transparent support material 15 which permits the particles 14 to have the desired rotational freedom without having translational freedom.

Figure 2A:
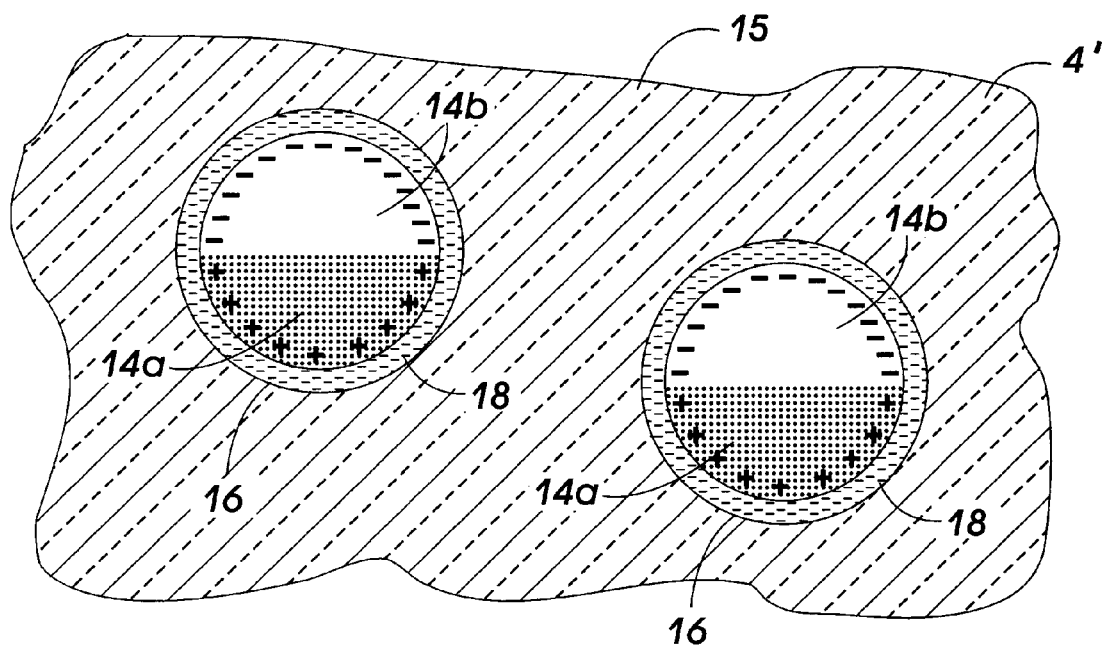

As shown in FIG. 2, the particles 14 of the panel 4 can be small spheres, typically 0.05 to 0.5 millimeters or smaller in diameter, which have hemispherical coatings of different Zeta potential. For example, as illustrated in FIG. 2a which shows a small, enlarged portion 4' of the panel 4, the difference in Zeta potential can be achieved by applying a coating to one hemisphere 14a of each of the spheres 14 that exhibits optical absorption characteristics, as illustrated by their dark shading, and applying a coating to the other hemisphere 14b of each of the spheres 14 that exhibits light reflectance characteristics, as illustrated by the absence of dark shading or discernable colors. The difference between the light reflectance-light absorption characteristics of hemispheres 14a and 14b provides the desired optical anisotropy. Each of the spheres 14 is located within a cavity 16 of transparent support material 15. Cavities 16 have a diameter slightly larger than the diameter of spheres 14 so that spheres 14 have rotational freedom without translational freedom. Filling the voids between spheres 14 and cavities 16 is an optically transparent dielectric liquid 18.

Due to the differences in Zeta potential between the hemisphere 14a and 14b and the immersion of each of the spheres 14 in the dielectric liquid 18, the spheres 14 acquire an electrical charge, as shown symbolically in FIG. 2A where hemispheres 14a are more positive than hemisphere 14b. When an electrical potential (voltage gradient) is applied across the spheres 14, as shown in FIG. 2, the positively charged hemisphere 14a will be attracted to the more negative electrode 19a the spheres 14 within the field developed by the energized electrodes and will rotate, but without substantial translation, such that the light reflecting hemispheres 14b are oriented toward 1. Thus, a light area on a dark background is provided. By reversing the polarity of source 19, a black spot on a light background can be provided. If voltage potentials are applied across all areas of the display area (either sequentially or simultaneously) and image can be formed. If the same polarity is applied to all areas, the image will be homogeneous (light or dark), but if the voltage is different in some areas, a visible pattern will be formed. For a more complete description of how "Electric Paper" operates, see the above cited patents.

Figure 3:
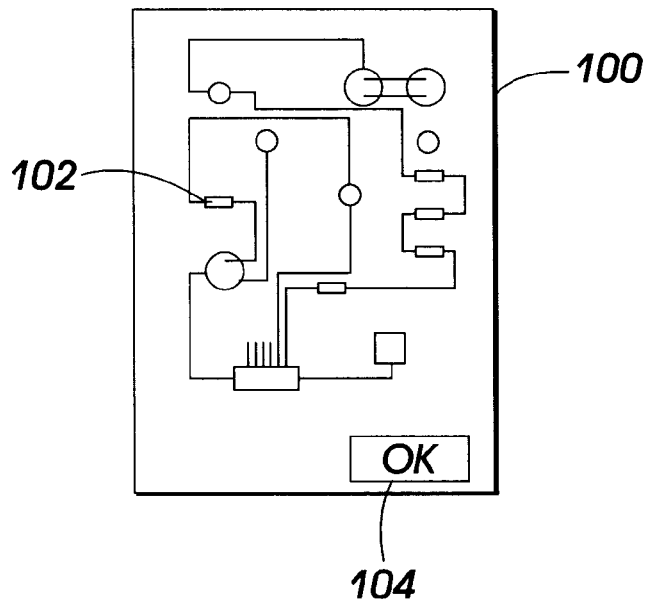
FIG. 3 is a plan view of an indicator on a circuit board.
Figure 4:
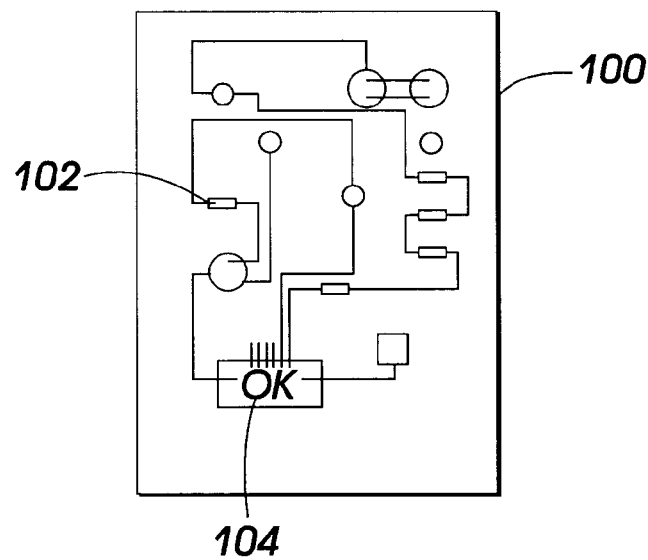
FIG. 4 is a plan view of an indicator on an electrical component.

FIG. 3 shows the "Electric Paper" indicator 104 mounted to a circuit board 100 with electrical components 102. In this configuration, the "Electric Paper" indicator 104 has been placed adjacent to or on electrical components 102 which is to be monitored. One way to detect positive and negative electrical discharges created by electric fields is to create an image on the indicator in the above described manner. For example, when the word "OK" is imaged in black with a white background prior to placement of the indicator on the circuit board, a negative ESD will cause the spheres with viewable black hemispheres to rotate, resulting in all or part of the disappearance of the word "OK". When a positive ESD is applied, the spheres with the originally viewable white hemispheres will rotate to show black hemispheres, again disturbing the pattern. FIG. 4 shows placing indicator 104 on the electrical component to be monitored.

Figure 5:
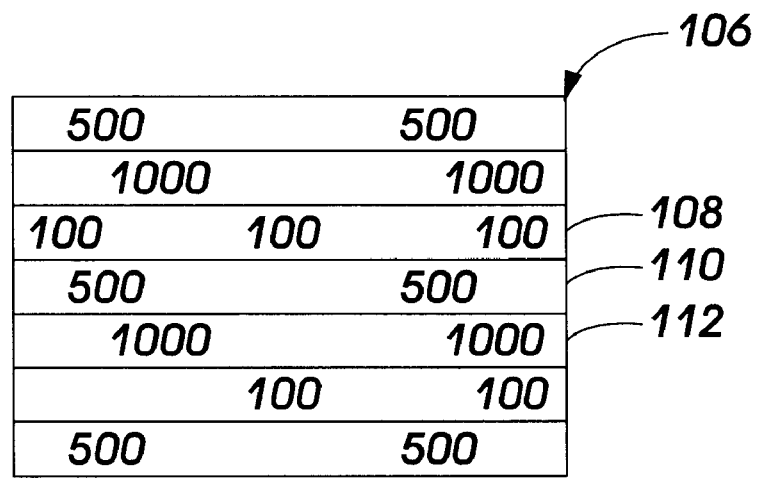
FIG. 5 is a plan view of an indicator with different voltage sensitive sections.

The threshold voltage necessary for the spheres to rotate can have different values, with the indicator having a minimum threshold of about 100 Volts. An indicator 106 with a plurality of threshold voltages is shown in FIG. 5. For example, one section of the indicator 108, is activated over 100 V, another section, 110, over 500 V and another section, 112, over 1000 V, each image indicating the threshold voltage of its respective section. Depending upon the sensitivity of the device with which the indicator is associated, various levels of ESD may be indicated. Of course, the threshold voltages may be in increments other than the 100, 500, 1,000 Volt example, depending upon the electrical characteristics of the device to be monitored. Also, the specific image or pattern of the indicator can be varied, the image on a potentially exposed indicator being compared with the unexposed ESD image to determine whether an ESD event has occurred. The size of the image disturbance is also an indicator of the electrical potential applied to the device.

Figure 6:
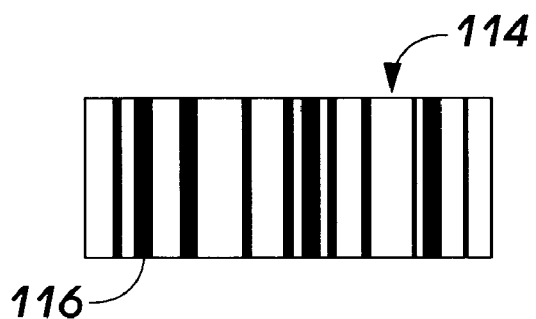
FIG. 6 is a plan view of an indicator with a machine readable image.
Figure 7:
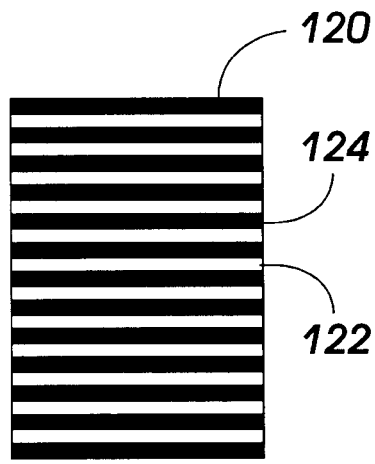
FIG. 7 is a plan view of an indicator with a striped pattern.

FIG. 6 shows an original, unexposed image on indicator 114 as a machine readable image 116, in this case, a bar code image. Using a machine readable image indicator is an easy way to keep track of ESD sensitive items, especially in assembly line, shipping and servicing operations. This embodiment takes advantage of the very thin profile of "Electric Paper". The indicator can be applied as a label to a package and read with a bar code reader. Thus, if the bar code reader or other scanner indicates that the package has been exposed to an unacceptable ESD, the package may be returned, unopened to the sender. Another pre-imaged indicator 120 is shown in FIG. 7, the white lines and the black lines are narrow and closely spaced so that both positive and negative electrostatic discharges will be detected. Both types of electrostatic discharges can be detected due to the fact that both white and black lines will be affected by an electrostatic discharge. Of course, indicator 120 can have any pattern.

Figure 8:
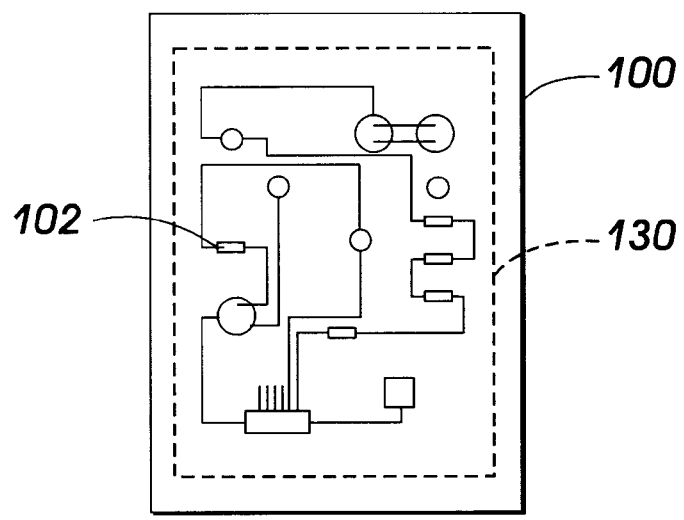
FIG. 8 is a plan view of an indicator extending the width and length of a circuit board.

Another way to use the ESD indicator is shown in FIG. 8 in which an indicator 130 extends substantially the length and width of the circuit board 100. When there is no pre-imaging on the indicator, only one type of ESD event can be recorded. Originally the indicator is all one color, for example white. When an ESD event occurs, the spheres in the area of the discharge react to the charge and rotate so that the black hemispheres are visible. The indicator can be viewed to see which areas of the circuit board were exposed to the ESD. Only one type of ESD can be monitored with this indicator. Of course, if a pattern as in 120 above is originally applied, either ESD may be detected.

Figure 9:
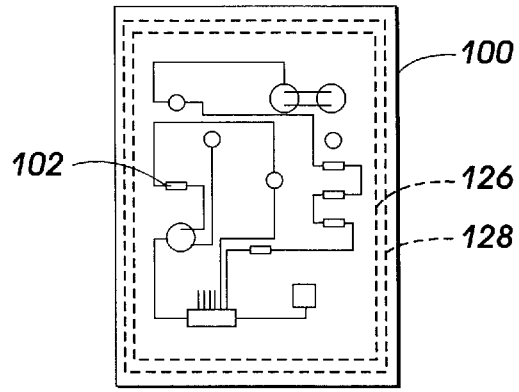
FIG. 9 is a plan view of two indicators extending the width and length of a circuit board.
Figure 10:
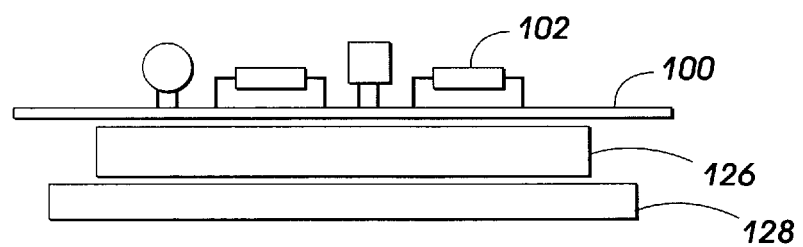
FIG. 10 is a side view of FIG. 9.

In yet another example, see FIG. 9 both positive and negative ESD can be detected by having two different layers of electric paper, for example, one indicator 126 with all the white hemispheres originally showing for white paper 128 and the other layer with all the black hemispheres originally showing for black paper so that after a positive electric field is applied to the white paper, the white hemispheres rotate to show the black hemispheres and after a negative electric field is applied to the black paper, the black hemispheres rotates to show the white hemispheres. In this embodiment, both indicators 126 and 128 are positioned relative to an entire circuit board 100 or area of interest so that any type of electrostatic discharge applied to any electrical component 102 will be detected. FIG. 10 shows a side view of indicators 126 and 128 located relative to circuit board 100. The relative locations of the circuit board and indicators 126 and 128 may be changed without affecting the operability of the indicators.

At certain workplaces, it is important to eliminate electrostatic discharges which could damage electronic components. Handling integrated circuits on a workbench or at a desk are two examples. A sheet of electric paper may be placed on a grounded worksurface to provide a record of any discharges in the area as a means to confirm that anti-static measures are effective. The sheet could also be used during servicing or even placed in a copier or printer near a suspected failed component to see if there is, in fact, a discharge.

The effect of the electrostatic discharge is enhanced if the surface or back of the sheet is grounded. Any discharge to the worksurface or part of the worksurface causes a residual disturbance in the electrostatic paper display. The location and size of the disturbance are related to the magnitude and position of the discharge. For example, a wrist strap may come loose when the operator reaches to the back of the area so there would be a discharge pattern in that back area on the electric paper sheet.

Figure 11:
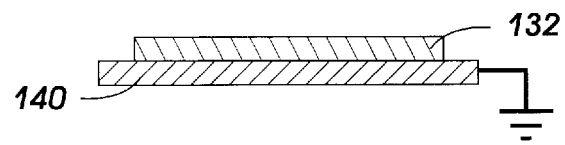
FIG. 11 is a side view of an indicator on a metallic support.

FIG. 11 shows an indicator 132 on a metal layer 140. The metal layer assists in protecting the device from the effects of ESD and does not affect the operability of the indicator. Metal layer 140 may optionally be grounded as shown.

Figure 12:
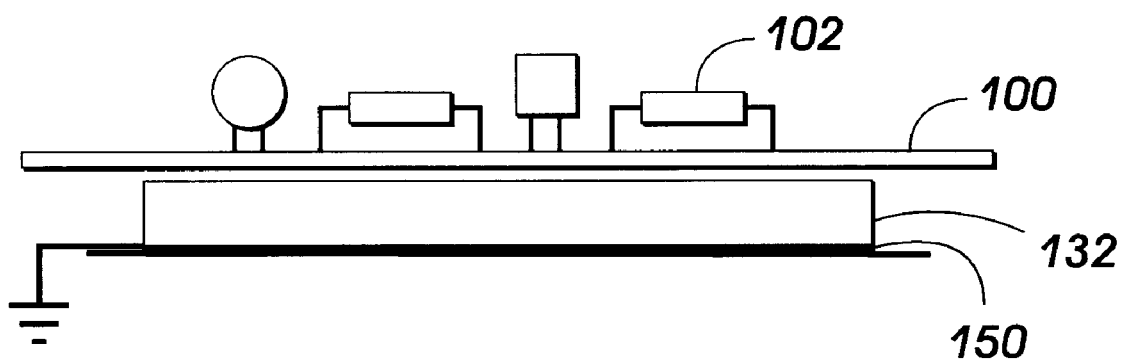
FIG. 12 is a side view of an indicator with a metallic backing.

FIG. 12 shows an indicator 132 with a metal backing layer 150. The metal layer assists in protecting the device from the effects of ESD and does not affect the operability of the indicator. Metal layer 150 may optionally be grounded as shown.

The electric paper indicators are an important diagnostic tool to be used in the manufacturing as well as understanding the operating conditions of circuit boards, especially since the recorded information can be directly inputted to a computer for analysis. All of the indicators previously discussed can also have areas of different voltage sensitivities, depending on the electrical characteristics of the circuit board to be monitored.

In all of the above embodiments, once the indicator has been exposed to an ESD event that causes the indicator to change, the indicator can be reset to the original unexposed ESD condition. In the "OK" example, when ESD causes the spheres with the black hemispheres visible to rotate, the original imaging potential can be re-applied, causing the specified spheres with the white hemispheres visible to rotate to form the word "OK".

The indicator may be placed with respect to a circuit board or other device to be monitored in any manner. For example, the indicator may be glued or taped in position. In a more rudimentary form, the support layer 15 may be paint with the particles 14 imbedded in it.

It is, therefore, apparent that there has been provided in accordance with the present invention, an electrostatic discharge indicator that fully satisfies the aims and advantages hereinbefore set forth. While this invention has been described in conjunction with a specific embodiment thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. A method of detecting a random electrostatic discharge event applied to an item comprising:

placing a support in electrostatic discharge detecting relationship to the item; the support having a plurality of particles contained therein, the particles being sensitive to electronic fields and visually indicating exposure to electronic fields, the particles being in a first visual state; and exposing the support to an electric field in the form of an electrostatic discharge so that the particles exposed to the electrostatic discharge have a second visual state which is different from the first visual state, wherein the second visual state occurs without further processing of the support, further comprising:

placing the support on a grounded metal plate.

2. A detector for detecting and recording a random electrostatic discharge event applied to an item in the vicinity of the detector, comprising:

a first support of optically transparent material;

a plurality of cavities in the support; and a plurality of optically and electrically anisotropic particles rotatably disposed in the cavities in the first support, each of the particles electrical anisotropy providing an electrical dipole moment, disposed in an electric field while the electrical dipole moment is provided, the particle tends to rotate to an orientation in which the electrical dipole moment aligns with the electric field, the particles thus disposed being responsive to an electrostatic discharge applied to the support such that when the electrostatic discharge is applied to the support the particles thus exposed to the electrostatic discharge will tend to rotate in accordance with their electrical anisotropy to provide a first electrostatic discharge display in accordance with their optical anisotropy, the first electrostatic discharge display recording the random electrostatic discharge event occurring in the vicinity of the item, wherein the detector further comprises:

a metallic backing layer on the support.

3. The apparatus as claimed in claim 2, wherein the metallic backing layer is grounded.

4. A method of detecting and recording a random electrostatic discharge event occurring in the vicinity of an item, comprising:

placing a first support of optically transparent material having a plurality of cavities and a plurality of optically and electrically anisotropic particles rotatably disposed in the cavities in the first support, each of the particles electrical anisotropy providing an electrical dipole moment, disposed in an electric field while the electrical dipole moment is provided, the particle tends to rotate to an orientation in which the electrical dipole moment aligns with the electric field, the particles thus disposed being responsive to a random electrostatic discharge event applied to the support; and exposing the first support to an electrostatic discharge, whereby the particles exposed to the electrostatic discharge will rotate in accordance with their electrical anisotropy to provide a first electrostatic discharge display in accordance with their optical anisotropy.

5. A method as claimed in claim 4, further comprising:

applying a controlled electric field across selected portions of the first support whereby the particles exposed to the controlled electric field will rotate in accordance with their electrical anisotropy to provide a first original display in accordance with their optical anisotropy, the electrostatic discharge causing the first original display to change to the first electrostatic discharge display.

6. A method as claimed in claim 5, further comprising:

recording the electrostatic discharge display with an electronic recording device.

7. A method as claimed in claim 5, wherein said applying step further comprises:

forming a pattern on the original display so that both positive and negative electrostatic discharges are detected.

8. A detector for detecting and recording a random electrostatic discharge event applied to an item in the vicinity of the detector, comprising:

a first support of optically transparent material;

a plurality of cavities in the support; and a plurality of optically and electrically anisotropic particles rotatably disposed in the cavities in the first support, each of the particles electrical anisotropy providing an electrical dipole moment, disposed in an electric field while the electrical dipole moment is provided, the particle tends to rotate to an orientation in which the electrical dipole moment aligns with the electric field, the particles thus disposed being responsive to an electrostatic discharge applied to the support such that when the electrostatic discharge is applied to the support the particles thus exposed to the electrostatic discharge will tend to rotate in accordance with their electrical anisotropy to provide a first electrostatic discharge display in accordance with their optical anisotropy, the first electrostatic discharge display recording the random electrostatic discharge event occurring in the vicinity of the item.

9. A detector as claimed in claim 8, wherein there are at least two support sections, each support section having a different threshold voltage that will cause the particles to rotate and each support section has a different first original display.

10. A detector as claimed in claim 8, wherein the item to be monitored is a plurality of electronic components mounted on a circuit board, the first support being in electrostatic discharge detecting relationship to all of the electronic components.

11. A detector as claimed in claim 8, wherein the electrostatic discharge detected has a minimum voltage of about 100 Volts.

12. A detector as claimed in claim 8, further comprising:

a second support similar to the first support, wherein the particles in the first support rotate when an electrostatic field of a first polarity is applied to the first support and the particles in the second support rotate when an electrostatic field of a second polarity is applied to the second support.

13. A detector as claimed in claim 12, wherein the first and second supports are arranged so that both positive and negative electrostatic fields applied to the item are detected.

14. A detector as claimed in claim 13, wherein the item to be monitored is a plurality of electronic components mounted on a circuit board, the first and second supports being in electrostatic discharge detecting relationship to the plurality of electronic components.

15. A detector as claimed in claim 8, further comprising:

an imaging device for applying a controlled electric field across selected portions of the first support whereby the particles exposed to the controlled electric field will rotate in accordance with their electrical anisotropy to provide a first original display in accordance with their optical anisotropy, the electrostatic discharge causing the first original display to change to the first electrostatic discharge display.

16. A detector as claimed in claim 15, wherein the imaging device comprises:

electrodes on opposite sides of the first support; and a power source for applying the controlled electric field to the support.

17. A detector as claimed in claim 15, wherein the controlled electric field is produced by an external power source.

18. A detector as claimed in claim 15, wherein the first original display has a first pattern so that electrostatic discharges of positive or negative polarity are detected.

19. A detector as claimed in claim 15, wherein the first support is connected to a recording device that records the electrostatic discharge display.

* * * * *